(12) United States Patent
Sparks et al.

(10) Patent No.: US 7,381,628 B2
(45) Date of Patent: Jun. 3, 2008

(54) PROCESS OF MAKING A MICROTUBE AND MICROFLUIDIC DEVICES FORMED THEREWITH

(75) Inventors: Douglas Ray Sparks, Whitmore Lake, MI (US); Nader Najafi, Ann Arbor, MI (US)

(73) Assignee: Integrated Sensing Systems, Inc., Ypsilanti, MI (US)

( * ) Notice: Subject to any disclaimer, the term of this patent is extended or adjusted under 35 U.S.C. 154(b) by 179 days.

(21) Appl. No.: 11/276,233

(22) Filed: Feb. 20, 2006

(65) Prior Publication Data

US 2006/0175303 A1    Aug. 10, 2006

Related U.S. Application Data

(63) Continuation-in-part of application No. 11/161,901, filed on Aug. 22, 2005.

(60) Provisional application No. 60/603,156, filed on Aug. 20, 2004.

(51) Int. Cl.
*H01L 21/30* (2006.01)

(52) U.S. Cl. .................. 438/456; 438/53; 438/459; 257/414

(58) Field of Classification Search ................ 438/48, 438/50, 51, 53, 456
See application file for complete search history.

(56) References Cited

U.S. PATENT DOCUMENTS 6,477,901 B1 * 11/2002 Tadigadapa et al. ... 73/861.352

* cited by examiner

*Primary Examiner*—Matthew S. Smith
*Assistant Examiner*—Phillip S Green
(74) *Attorney, Agent, or Firm*—Hartman & Hartman, P.C.; Gary M. Hartman; Domenica N.S. Hartman

(57) ABSTRACT

A process for producing a tube suitable for microfluidic devices. The process uses first and second wafers, each having a substantially uniform doping level. The first wafer has a first portion into which a channel is etched partially therethrough between second and third portions of the first wafer. The first wafer is then bonded to the second wafer so that a first portion of the second wafer overlies the first portion of the first wafer and encloses the channel to define a passage. The second wafer is then thinned so that the first portion thereof defines a thinned wall of the passage. Second and third portions of the second wafer and part of the second and third portions of the first wafer are then removed, and the thinned wall defined by the second wafer is bonded to a substrate such that the passage projects over a recess in the substrate surface. The second and third portions of the first wafer are then removed to define a tube with a freestanding portion.

20 Claims, 4 Drawing Sheets

PROCESS OF MAKING A MICROTUBE AND MICROFLUIDIC DEVICES FORMED THEREWITH

CROSS REFERENCE TO RELATED APPLICATIONS

This application is a continuation-in-part patent application of co-pending U.S. patent application Ser. No. 11/161,901 filed Aug. 22, 2005, which claims the benefit of U.S. Provisional Application No. 60/603,156, filed Aug. 20, 2004. The contents of co-pending Ser. No. 11/161,901 are incorporated herein by reference.

BACKGROUND OF THE INVENTION

The present invention generally relates to micromachining processes and devices formed thereby. More particularly, this invention relates to a process of forming a micromachined tube suitable for a microfluidic device.

Processes for fabricating resonant mass flow and density sensors using silicon micromachining techniques are disclosed in commonly-assigned U.S. Pat. Nos. 6,477,901 and 6,647,778. As used herein, micromachining is a technique for forming very small elements by bulk etching a substrate (e.g., a silicon wafer), and/or by surface thin-film etching, the latter of which generally involves depositing a thin film (e.g., polysilicon or metal) on a sacrificial layer (e.g., oxide layer) on a substrate surface and then selectively removing portions of the sacrificial layer to free the deposited thin film. In the processes disclosed in U.S. Pat. Nos. 6,477,901 and 6,647,778, wafer bonding and etching techniques are used to produce a micromachined tube supported above a surface of a substrate. The tube can be vibrated at resonance, by which the flow rate, density, and/or other properties or parameters of a fluid flowing through the tube can be measured.

According to one embodiment of U.S. Pat. No. 6,477,901, a tube is formed using p-type doped layers and selective etching techniques. The doped layers form the walls of the tube, and therefore determine and limit the size of the tube walls as well as the cross-sectional dimensions of the tube. According to another embodiment of U.S. Pat. No. 6,477,901, a tube is formed with the use of a silicon-on-insulator (SOI) wafer. The buried oxide layer of the SOI wafer is used as an etch stop in a manner that determines and can limit the thickness of the tube. Another consideration of this embodiment is the higher cost of SOI silicon wafers as compared to standard silicon wafers. In co-pending U.S. patent application Ser. No. 11/161,901, a process is disclosed by which an epitaxial wafer can be employed to avoid the cost of using a SOI wafer. Though of considerably lower cost than SOI silicon wafers, epitaxial silicon wafers are significantly more expensive than standard silicon wafers.

In view of the above, while well suited for producing micromachined tubes for microfluidic devices, it would be advantageous if other micromachining processes were available that avoid the size restraints of previous processes, as well as potentially simplify processing and reduce cost and processing time.

BRIEF SUMMARY OF THE INVENTION

The present invention provides a process for producing a micromachined tube suitable for microfluidic devices. While resonating tubes for mass flow and density sensors of the types disclosed in U.S. Pat. Nos. 6,477,901 and 6,647,778 are notable examples, other tubular structures within the scope of this invention include stationary tubes, diaphragms, and channels for such microfluidic devices as needles, cannula, pressure sensors, temperature sensors, motion sensors, drug infusion devices, and other devices that can employ microtubes.

The process of this invention entails the use of first and second wafers, each having a thickness throughout which the wafers preferably have substantially uniform doping levels. A channel is etched in a first portion of the first wafer in a direction of the thickness thereof. The channel is etched to extend not entirely through the thickness of the first wafer, though preferably through more than half the thickness, and is between second and third portions of the first wafer. The first wafer is then bonded to the second wafer so that a first portion of the second wafer overlies the first portion of the first wafer and encloses the channel therein to define a passage, and so that second and third portions of the second wafer overlie the second and third portions of the first wafer. The second wafer is then thinned so that the first portion thereof defines a thinned wall of the passage. The second and third portions of the second wafer and some but not all of the second and third portions of the first wafer underlying the second and third portions of the second wafer are then removed, such that the first portions of the first and second wafers define a protrusion. The thinned wall defined by the first portion of the second wafer is then bonded to a substrate adjacent a recess in a surface of the substrate such that a portion of the passage projects over the recess. Finally, the second and third portions of the first wafer are removed such that the thinned wall defined by the first portion of the second wafer, walls defined by the first portion of the first wafer, and the passage therein define a tube, and a free-standing portion of the tube projects over the recess in the substrate so as to be capable of movement relative thereto.

In view of the above, it can be seen that the depth and width of the channel in the first wafer determine the height and width, respectively, of the passage within the tube, and the remaining thickness of the first wafer following etching of the channel determines the thickness of one of the walls of the tube. Therefore, the height of the tube passage and the thickness of the tube walls are not limited by any doped or buried oxide layers, as has been done in the past. As a result, larger tubes can be micromachined by the process of this invention. Larger tubes are able to achieve lower pressure drops and permit higher flow rates within microfluidic systems containing the tubes, without necessitating an increase in the in-plane (width) dimensions of the tube or the substrate carrying the tube. As such, the invention enables tube passage dimensions to be increased vertically (with or without an increase in in-plane dimensions) to achieve higher flow rates, and if horizontal dimensions are held constant can achieve higher flow rates without an increase in chip size, and in some cases while even permitting smaller chip sizes. The elimination of SOI wafers in the manufacturing process is a cost advantage of the present invention, as is the absence of epitaxial layers to define portions of the tube.

Other objects and advantages of this invention will be better appreciated from the following detailed description.

DETAILED DESCRIPTION OF THE INVENTION

FIGS. 1 through 9 represent steps in a process carried out to produce a micromachined tube (40 in FIGS. 8 and 9) suitable for a variety of microfluidic devices. It should be noted that the drawings are drawn for purposes of clarity when viewed in combination with the following description, and therefore are not necessarily to scale.

Figure 1:
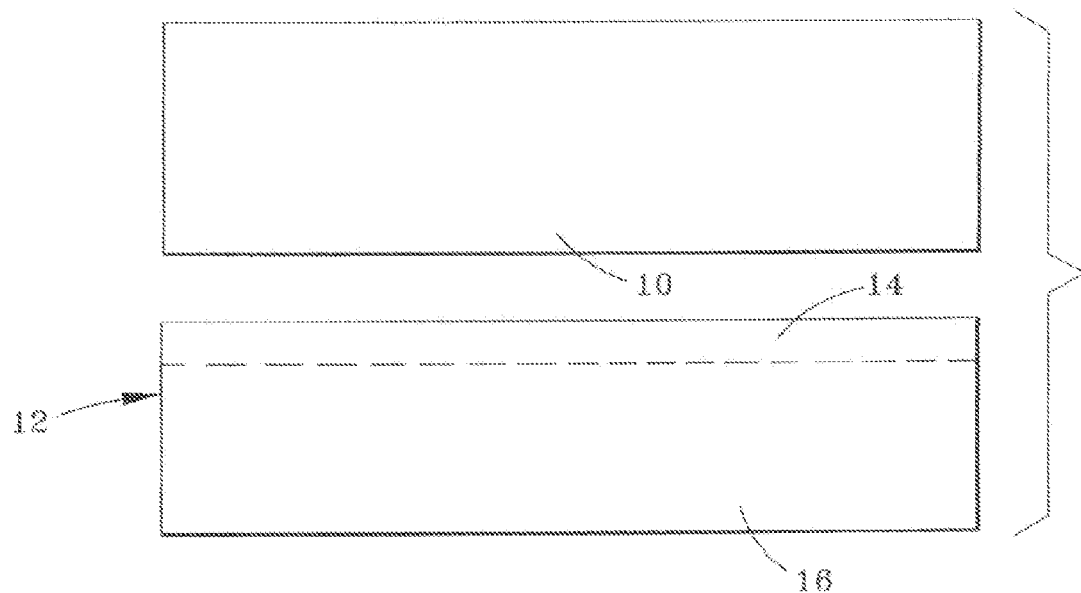
FIG. 1 show cross-sectional views of first and second wafers used to produce a micromachined tube in accordance with an embodiment of this invention.

FIG. 1 depicts a pair of wafers 10 and 12 (only a single chip region of which are shown for convenience) selected for processing in accordance with the invention. The wafers 10 and 12 are both preferably silicon, though other materials can be used including but are not limited to Ge, SiC, GaAs, Si/Ge, sapphire, glass, ceramic materials, plastic, and metallic materials. Furthermore, the wafers 10 and 12 can be single crystal or polycrystalline. Though undoped wafers could be used, the wafers 10 and 12 are preferably of constant doping throughout their thicknesses, which provides for a uniform rate of etching of the wafers 10 and 12 as discussed below. The type (n or p-type) and doping level can be tailored as may be required or desired by one skilled in the art. Heavy p-type doping (e.g., with boron, aluminum, or gallium) is preferred for improving etching and corrosion resistance, though lighter doping can be used to enable the wafers 10 and 12 to be more readily inspected for defects by infrared (IR) radiation. The thickness of the wafers 10 and 12 will typically vary from about 100 to about 1500 micrometers, though less or greater thicknesses are also within the scope of this invention. According to a preferred aspect of the invention, the thickness of the wafer 10 determines the height dimensions of the tube 40 (dimensions measured in a direction normal to the wafer surface). As such, a particularly suitable thickness for the wafer 10 is about 500 micrometers.

The second wafer 12 is represented as having a surface region 14 overlying a substrate region 16. In a preferred embodiment, the second wafer 12 is a uniformly-doped wafer of silicon or another semiconductor material such as germanium, such that the surface region 14 and substrate region 16 are doped similar in type and level. A preferred doping level for the wafer 12 achieves a resistivity of about 0.1 to about 0.01 ohm-cm. While the wafer 12 is uniformly doped in accordance with the preferred embodiment of the invention, other wafer configurations could be used in accordance with co-pending U.S. patent application Ser. No. 11/161,901, as well as wafers in which the surface region 14 is a diffused layer, a boron or B/Ge doped layer, or a buried doped layer, as will be appreciated by those skilled in the art. To obtain a desired configuration and thickness, the wafer 12 can undergo various processes, including wet chemical etching (selective, timed, etc.), dry etching (e.g., ion milling, plasma enhanced etching, reactive ion etching (RIE), deep reactive ion etching (DRIE), mechanical removal (grinding, polishing, etc.), chemical-mechanical polishing (CMP), etc. From the following discussion it will become evident that the surface region 14 establishes the thickness of a wall (24 in FIGS. 6 through 9) of the tube 40.

Figure 2:
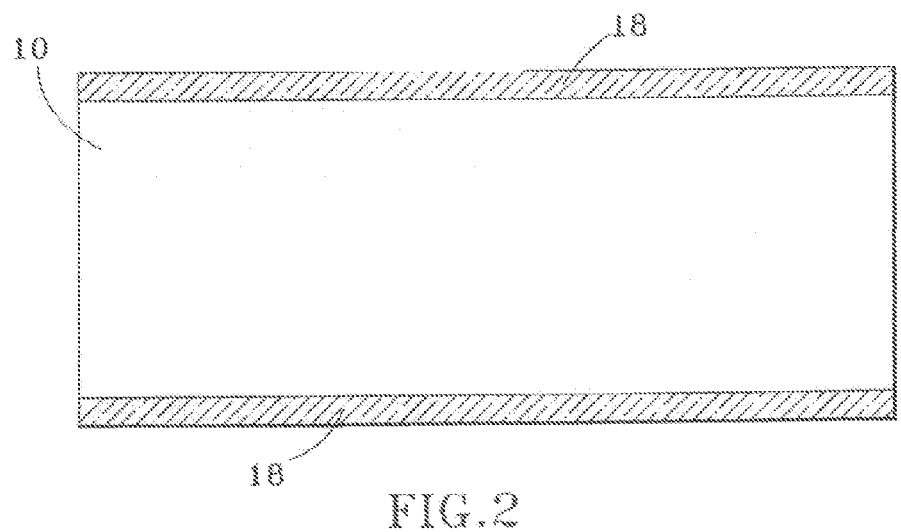
FIGS. 2 and 3 depict masking and etching steps performed on the first wafer of FIG. 1 to form a channel in the first wafer
Figure 3:
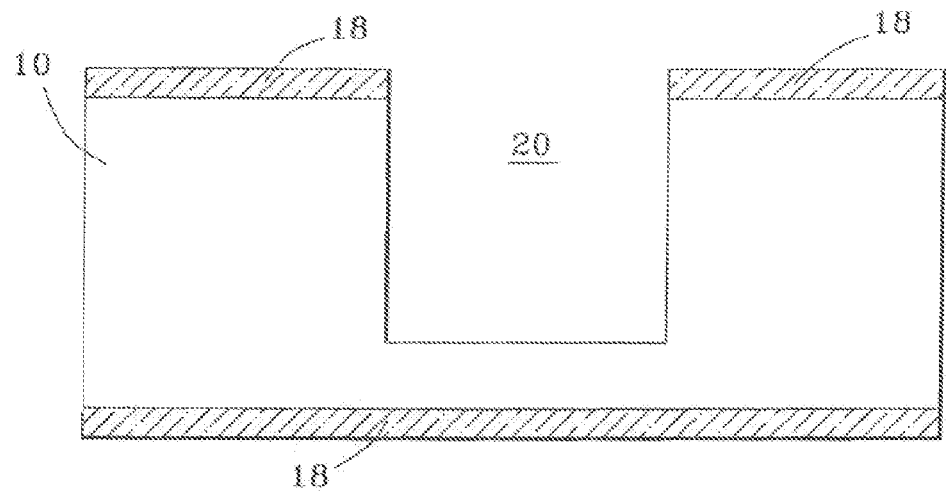

FIG. 2 shows the wafer 10 as being provided with masks 18 to protect its surfaces from attack during an etching step, the result of which is shown in FIG. 3. The masks 18 can be formed by depositing or growing an oxide on the surfaces of the wafer 10, though other materials known in the art can be used to mask the wafer 10, including but not limited to silicon nitride, combined silicon oxide and silicon nitride, photoresists, polymers, metals, dielectrics, etc. FIG. 3 shows the result of removing a portion of one of the masks 18 and then etching a channel 20 into the wafer 10. The channel 20 is represented as being roughly rectilinear, though other shapes are possible including but not limited to a trench with rounded corners. Various removal techniques can be employed, such as but not limited to wet chemical removal (e.g., selective chemical etching, timed etching, etc.) and dry etching (e.g., ion milling, plasma enhanced etching, RIE, DRIE, etc.). To obtain the roughly rectilinear cross-section shown for the channel 20, a preferred etching technique is to use a plasma that is anisotropic, in some cases via sidewall deposition. As such, preferred etching techniques are believed to be dry etching, particularly RIE or DRIE, as well known in the art. However, the desired vertical/straight sidewalls of the channel 20 can be obtained by forming the wafer 10 of a (110) oriented silicon and using a wet etch technique to form the channel 20. Throughout this description, wet etching is considered an alternative method to the etching steps that have been or will be noted.

As previously noted, the entire thickness of the wafer 10 is used to form the tube 40 and determines its height dimensions. Furthermore, the depth of the channel 20 determines the inner height dimension of the passage 36 (FIGS. 7 and 8) within the tube 40. As such, etching of the channel 20 is a generally long process, and preferably extends through about 75% to about 90% of the thickness of the wafer 10. As such, a tube passage 36 with a height in excess of about 400 micrometers is possible with this invention if a conventional silicon wafer (thickness of up to 1500 micrometers) is used.

Figure 4:
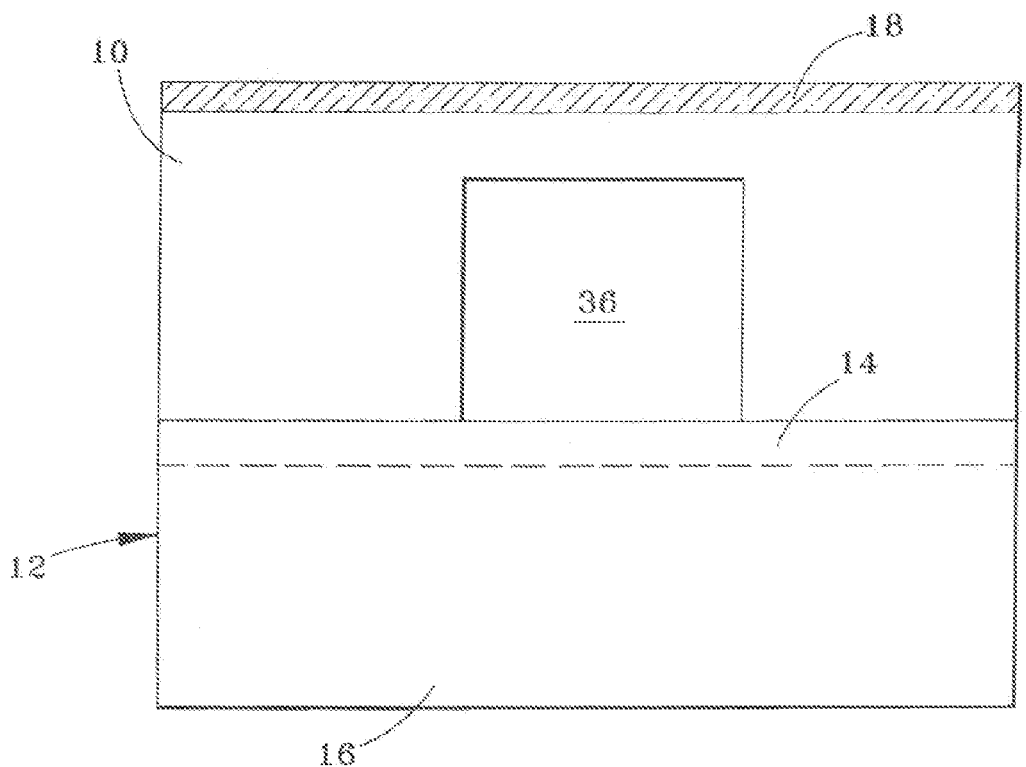
FIG. 4 depicts the result of bonding the first wafer of FIG. 3 to the second wafer of FIG. 1 to enclose the channel and form a passage within the first wafer.

FIG. 4 represents the result of cleaning and then bonding the wafer 10 to the surface region 14 of the wafer 12. Bonding can be accomplished with a variety of techniques, such as fusion, direct, anodic, solder, eutectic, and adhesive bonding. Silicon fusion bonding is the preferred method if the wafers 10 and 12 are formed of silicon, as this technique can be performed at room temperature under vacuum or at ambient pressures with a plasma-assisted bonding mechanism. A high temperature anneal/oxidation can be employed to strengthen the silicon fusion bond.

Figure 5:
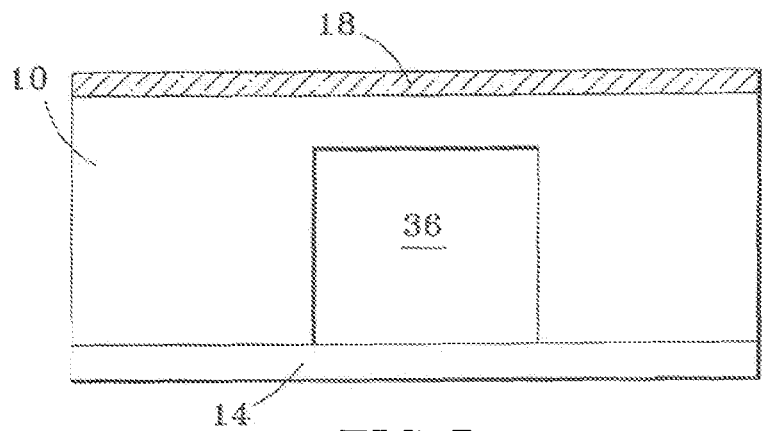
FIG. 5 depicts the result of removing all but a surface layer or region of the second wafer.

FIG. 5 shows the substrate region 16 of the wafer 12 as having been removed, leaving only the surface region 14. Removal of the substrate region 16 can be by lapping, polishing, grinding, wet or dry etching, or a combination of these techniques. A timed etch or timed mechanical removal process can be used to ensure the remaining surface region 14 has a suitable thickness for the wall 24 of the tube 40. Thickness measurements of the remaining surface region 14 can be employed to improve the accuracy of such thinning techniques. Suitable thicknesses for the tube wall 24 will depend on the particular application for the tube 40. Particularly suitable thicknesses for the tube wall 24 (and therefore the surface region 14 of the wafer 12) are believed to be about 10 to about 100 micrometers, with a preferred thickness of about 50 micrometers.

Figure 6:
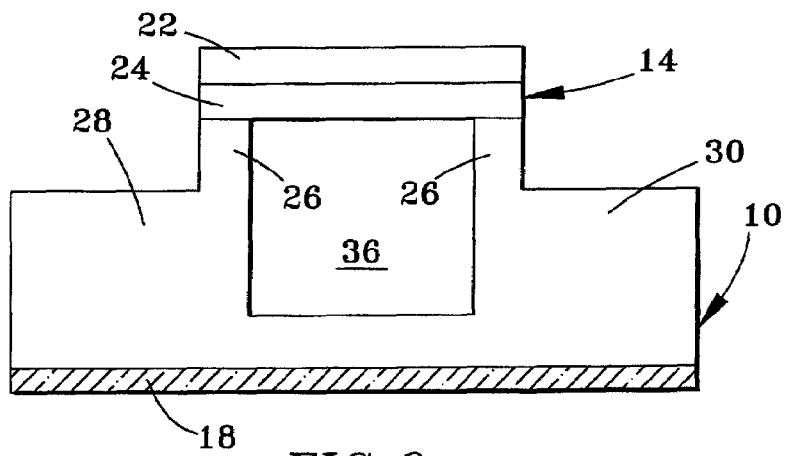
FIGS. 6 and 7 depict the results of removing portions of the surface layer of the second wafer and underlying portions of the first wafer to either side of the passage, and then bonding the remaining portion of the surface layer to a substrate.

FIG. 6 shows the result of masking and etching the surface region 14 to define the wall 24 of the tube 40 and form portions of sidewalls 26 for the tube 40. For this step, a resist mask 22 is represented as being employed, though other masking materials and techniques could foreseeably be used, such as an oxide layer, combination of resist and oxide layer, etc. As evident from FIG. 6, this etching step is used to etch entirely through the surface region 14 but only partially etch through the thickness of the wafer 10. As a result, the final depth of this etch is dependent on the total thickness of the surface region 14 and the wafer 10, and the strength desired for the remaining portion of the wafer 10. Leaving a significant amount of the thickness of the wafer 10 will enable the wafer stack to more readily survive manufacturing handling. For this reason, less than half the thickness of the side portions 28 and 30 of the wafer 10 are shown in FIG. 6 as having been etched away. For example, if the wafer 10 is about 500 micrometers in thickness, this etch might remove up to about 150 micrometers of the wafer 10.

Figure 7:
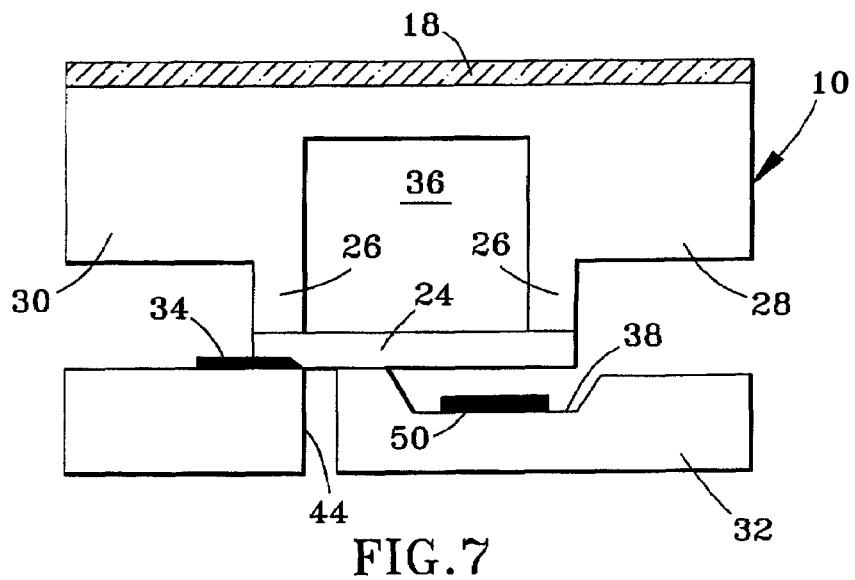

In FIG. 7, the wafer stack is shown as having been flipped and bonded to a micromachined and metallized substrate 32. The substrate 32 may be formed of a variety of materials, including Pyrex, borofloat, quartz, or other glass-type wafer, silicon, plastic, ceramic, or another material. A variety of bonding techniques can be employed for this purpose, with anodic bonding being preferred. FIG. 7 shows the wall 24 (formed by the remnant of the surface region 14) as contacting a metal pattern 34 on the substrate 32. By forming the wafer 12 and its surface region 14 to be sufficiently doped, the wall 24 is able to make electrical contact with the metal pattern 34 to enable electrical grounding or biasing of the tube 40. As a result of this step, a portion of the passage 36 formed when the channel 20 in FIG. 3 was closed by the surface region 14 is partially suspended above a recess 38 in the surface of the substrate 32. While inlet and outlet holes 44 (one of which is shown in FIG. 7) can be formed at this time by etching, such holes 44 can be formed during or after any of the following steps.

Figure 8:
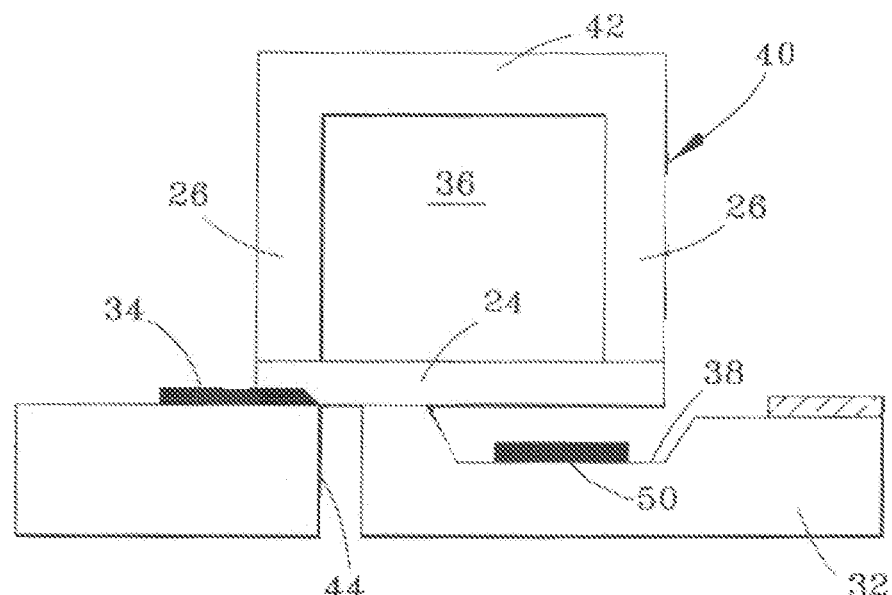
FIG. 8 depicts the result of removing the remaining underlying portions of the first wafer to yield a tube with a freestanding portion suspended over the substrate.

FIG. 8 shows the result of masking and etching the remainder of the wafer 10 to finish defining the tube 40 and its outer periphery, including its sidewalls 26 and its outer wall 42. For this process, a mask (not shown) can be aligned to the sidewalls 26 of the tube 40 (or to metallization or the recess 38 on the surface of the substrate 32) through the substrate 32 using double-side alignment tools or another similar technique known in the art. Alternatively, IR alignment can be employed. After alignment and development, the remaining outer portions 28 and 30 of the wafer 10 in FIG. 7 are removed, preferably by DRIE plasma etching. As an alternative method, a single plasma etch could be employed before or after bonding of the wafer stack to the substrate 32, and tabs or thick scribe street rims could be employed to mechanically reinforce the wafer 10 after etching prior to bonding.

The tube 40 can have a variety of shapes (in plan view), including but not limited to B-shaped, S-shaped, Z-shaped, double tubes, straight, and the U-shape of the resonating tubes of U.S. Pat. Nos. 6,477,901 and 6,647,778. If the tube 40 is intended to be vibrated, as is the case for the resonating tubes of U.S. Pat. Nos. 6,477,901 and 6,647,778, the portion of the tube 40 suspended above the recess 38 is a freestanding portion in which movement can be induced relative to the substrate 32. For this purpose, FIG. 8 shows a drive electrode 50 formed within the recess 38 for electrostatic coupling with the tube 40. If the lower wall 24 of the tube 40 facing the electrode 50 is conductive as a result of the surface region 14 of the wafer 12 being suitably doped, a separate electrode is not required on the tube 40 for electrostatically driving the freestanding portion of the tube 40 with the electrode 50. Alternatively, if necessary or desirable, the tube 40 could be formed to have another conductive material facing the recess 38 to enable electrostatic driving of the tube 40 with the electrode 50. It should be noted that vibration or other desired movement of the tube 40 relative to the substrate 32 can be induced in the tube 40 by means other than electrostatically, including but not limited to piezoelectrically, piezoresistively, acoustically, ultrasonically, magnetically, optically, or another actuation technique.

Figure 9:
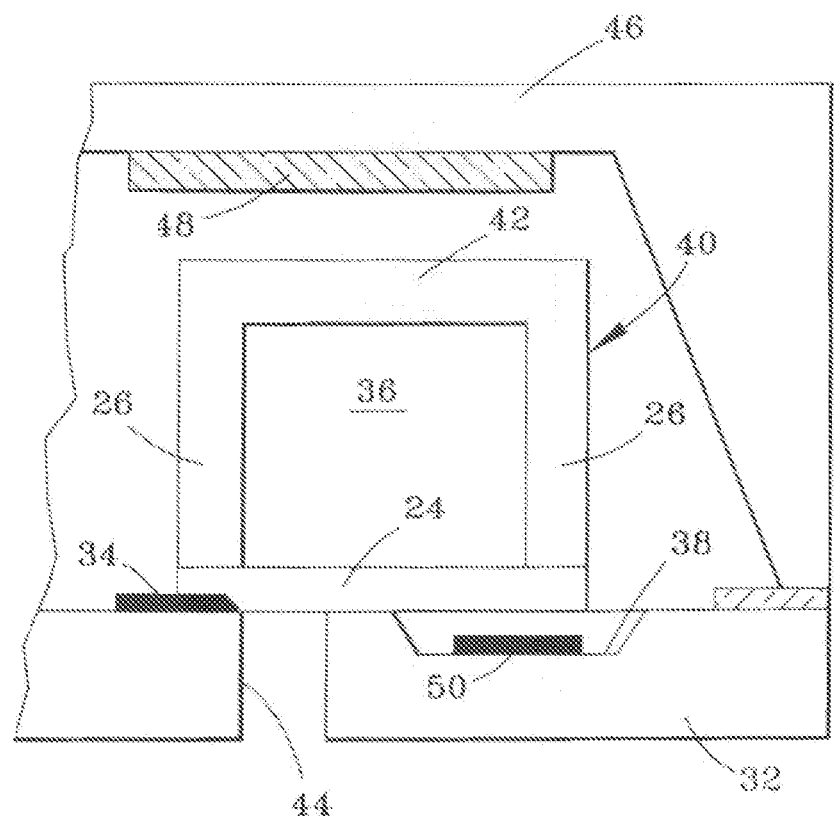
FIG. 9 depicts the result of bonding a capping wafer to the substrate to enclose the tube

Finally, FIG. 9 shows the result of bonding a capping wafer 46 to the substrate 32 to enclose the tube 40, preferably vacuum sealing the tube 40 between the substrate 32 and capping wafer 46 in order to enhance the dynamic performance of the tube 40 if the tube 40 is desired to vibrate, for example, in accordance with U.S. Pat. Nos. 6,477,901 and 6,647,778. As evident from FIG. 9, the capping wafer 46 must be thicker than the tube 40, so for a full wafer-thickness tube 40, a special thick wafer must be employed for the capping wafer 46. As such, a variety of materials for the capping wafer 46 can be considered, including but not limited to silicon, glass, ceramic, and plastic wafers that can be processed to have a relatively deep cavity sufficient to accommodate the tube 40. The capping wafer 46 is shown as having an integrated getter 48 to improve vacuum quality. Depending on the materials of the substrate 32 and capping wafer 46, sealing of the capping wafer 46 to the substrate 32 can be by glass frit sealing, eutectic bonding, solder bonding, anodic bonding, or other bonding technique known in the art. Alternatively, this step can be omitted if an acceptable vacuum can be formed without wafer-to-wafer bonding. In addition, the capping wafer 46 can be omitted and enclosure of the tube 40 can be performed in a subsequent packaging step, such as but not limited to IC packaging (e.g., an IC package with a Kovar lid) or product packaging.

While the invention has been described in terms of a particular embodiment, it is apparent that other forms could be adopted by one skilled in the art. Therefore, the scope of the invention is to be limited only by the following claims.

The invention claimed is:

1. A process of fabricating a micromachined tube for fluid flow therethrough, the process comprising the steps of:
   providing a first wafer having a thickness throughout which the first wafer has a substantially uniform doping level and a second wafer having a thickness throughout which the second wafer has a substantially uniform doping level;
   etching a channel in a first portion of the first wafer in a direction of the thickness thereof, the channel extending through more than half but not entirely through the thickness of the first wafer, the channel being between second and third portions of the first wafer;
   bonding the first wafer to the second wafer so that a first portion of the second wafer overlies the first portion of the first wafer and encloses the channel therein to define a passage, and so that second and third portions of the second wafer overlie the second and third portions of the first wafer;

thinning the second wafer so that the first portion thereof defines a thinned wall of the passage, wherein the thinned wall has a thickness of about 10 to about 100 micrometers;

removing the second and third portions of the second wafer and some but not all of the second and third portions of the first wafer underlying the second and third portions of the second wafer, such that the first portions of the first and second wafers define a protrusion;

bonding the thinned wall defined by the first portion of the second wafer to a substrate adjacent a recess in a surface of the substrate such that a portion of the passage projects over the recess; and then removing the second and third portions of the first wafer such that the thinned wall defined by the first portion of the second wafer, walls defined by the first portion of the first wafer, and the passage therein define a tube, a freestanding portion of the tube projecting over the recess in the substrate so as to be capable of movement relative thereto.

2. The process according to claim 1, wherein the first wafer is not an epitaxial wafer or a silicon-on-insulator wafer.

3. The process according to claim 1, wherein the second wafer is not an epitaxial wafer or a silicon-on-insulator wafer.

4. The process according to claim 1, wherein the first and second wafers are both doped either n-type or p-type.

5. The process according to claim 1, wherein the first and second wafers are formed of a material chosen from the group consisting of silicon, silicon-germanium alloys, germanium, sapphire, silicon carbide, polycrystalline and single crystal materials, gallium arsenide, metals, glass materials, ceramic materials, and plastic materials.

6. The process according to claim 1, wherein the channel is formed by an anisotropic etching technique.

7. The process according to claim 1, wherein the channel is formed by a plasma etching technique.

8. The process according to claim 1, wherein the second wafer has a resistivity of about 0.1 to about 0.01 ohm-cm.

9. The process according to claim 1, wherein the thinning step that defines the thinned wall of the passage is performed by a technique chosen from the group consisting of lapping, polishing, grinding, wet etching, dry etching, and combinations thereof.

10. The process according to claim 1, wherein the second and third portions of the second wafer and some but not all of the second and third portions of the second wafer channel is removed by masking the first portion of the second wafer and then etching the second and third portions of the second wafer exposed by the masking step followed by etching the second and third portions of the first wafer underlying the second wafer.

11. The process according to claim 1, wherein the second and third portions of the first wafer are etched to a depth of less than half the thickness or the first wafer.

12. The process according to claim 1, wherein bonding the thinned wall of the second wafer to the substrate results in the second wafer making electrical contact with a metal runner on the substrate.

13. The process according to claim 1, wherein the second and third portions of the first wafer are removed by a deep reactive ion etching technique.

14. The process according to claim 1, further comprising the step of vacuum sealing the tube between the substrate and a capping wafer.

15. The process according to claim 1, further comprising the step of forming holes in the substrate that fluidically interconnect with opposite ends of the tube to define a fluid inlet and a fluid outlet of the tube.

16. The process according to claim 1, further comprising the step of forming on the substrate means for vibrating the freestanding portion of the tube at a resonant frequency thereof and means for sensing movement of the freestanding portion of the tube relative to the substrate.

17. A process of fabricating a micromachined tube of a microfluidic device, the process comprising the steps of:
providing a first wafer having a thickness throughout which the first wafer is substantially uniformly doped and a second wafer having a thickness throughout which the second wafer is substantially uniformly doped;

anisotropically etching a channel in a first portion of the first wafer in a direction of the thickness thereof, the channel extending through more than half but not entirely through the thickness of the first wafer, the channel being between second and third portions of the first wafer;

bonding the first wafer to a second wafer so that a first portion of the second wafer overlies the first portion of the first wafer and encloses the channel therein to define a passage, and so that second and third portions of the second wafer overlie the second and third portions of the first wafer;

thinning the second wafer so that the first portion thereof defines a thinned wall of the passage;

masking the first portion of the second wafer;

etching the second and third portions of the second wafer exposed by the masking step followed by etching some but not all of the second and third portions of the first wafer, such that the first portions of the first and second wafers define a protrusion;

bonding the thinned wall defined by the first portion of the second wafer to a substrate adjacent a recess in a surface of the substrate such that a portion of the passage projects over the recess and the second wafer makes electrical contact with an electrical conductor on the substrate; and then removing the second and third portions of the first wafer such that the thinned wall defined by the first portion of the second wafer, walls defined by the first portion of the first wafer, and the passage therein define a tube, a freestanding portion of the tube projecting over the recess in the substrate so as to be capable of movement relative thereto.

18. The process according to claim 17, further comprising the steps of:
forming on the substrate means for vibrating the freestanding portion of the tube at a resonant frequency thereof and means for sensing movement of the freestanding portion of the tube relative to the substrate;

vacuum sealing the tube between the substrate and a capping wafer; and forming holes in the substrate that fluidically interconnect with opposite ends of the tube to define a fluid inlet and a fluid outlet of the tube.

19. A process of fabricating a micromachined tube for fluid flow therethrough, the process comprising the steps of:
providing a first wafer having a thickness throughout which the first wafer has a substantially uniform doping level and a second wafer having a thickness throughout which the second wafer has a substantially uniform doping level;

etching a channel in a first portion of the first wafer in a direction of the thickness thereof, the channel extending through about 75% to about 90% of the thickness of the first wafer, the channel being between second and third portions of the first wafer;

bonding the first wafer to the second wafer so that a first portion of the second wafer overlies the first portion of the first wafer and encloses the channel therein to define a passage, and so that second and third portions of the second wafer overlie the second and third portions of the first wafer;

thinning the second wafer so that the first portion thereof defines a thinned wall of the passage;

removing the second and third portions of the second wafer and some but not all of the second and third portions of the first wafer underlying the second and third portions of the second wafer, such that the first portions of the first and second wafers define a protrusion;

bonding the thinned wall defined by the first portion of the second wafer to a substrate adjacent a recess in a surface of the substrate such that a portion of the passage projects over the recess; and then removing the second and third portions of the first wafer such that the thinned wall defined by the first portion of the second wafer, walls defined by the first portion of the first wafer, and the passage therein define a tube, a freestanding portion of the tube projecting over the recess in the substrate so as to be capable of movement relative thereto.

20. The process according to claim 19, wherein the thinned wall has a thickness of about 10 to about 100 micrometers.

* * * * *